(12) United States Patent
Son

(10) Patent No.: US 8,247,872 B2
(45) Date of Patent: Aug. 21, 2012

(54) ESD PROTECTION CIRCUIT INCLUDING MULTI-FINGER TRANSISTOR

(75) Inventor: Hee-Jeong Son, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 331 days.

(21) Appl. No.: 12/637,335

(22) Filed: Dec. 14, 2009

(65) Prior Publication Data

US 2010/0149705 A1  Jun. 17, 2010

(30) Foreign Application Priority Data

Dec. 15, 2008  (KR) .................. 10-2008-0127087

(51) Int. Cl.
*H01L 23/62* (2006.01)
(52) U.S. Cl. .............. 257/355; 257/357; 257/E23.001
(58) Field of Classification Search ............. 257/355, 257/357, E23.001
See application file for complete search history.

(56) References Cited

U.S. PATENT DOCUMENTS

| | | | |
|---|---|---|---|
| 6,767,779 B2 * | 7/2004 | Parker et al. | 438/204 |
| 7,005,708 B2 * | 2/2006 | Mergens et al. | 257/360 |
| 7,511,345 B2 * | 3/2009 | Van Camp et al. | 257/355 |
| 7,750,409 B2 * | 7/2010 | Takasu et al. | 257/355 |
| 2002/0033507 A1 * | 3/2002 | Maria Verhaege et al. | 257/360 |

FOREIGN PATENT DOCUMENTS

| | | |
|---|---|---|
| CN | 101373766 | 2/2009 |
| KR | 1020020059039 | 7/2002 |
| KR | 1020060128563 | 12/2006 |
| KR | 1020070074036 | 7/2007 |
| KR | 1020080061005 | 7/2008 |

OTHER PUBLICATIONS

Notice of Allowance issued from Korean Intellectual Property Office on Sep. 29, 2010.
Notice of Preliminary Rejction issued from Chinese Patent Office on May 18, 2011.

* cited by examiner

*Primary Examiner* — Luan C Thai
(74) *Attorney, Agent, or Firm* — IP & T Group LLP

(57) ABSTRACT

Provided is an electrostatic discharge (ESD) protection circuit including a multi-finger transistor. The multi-finger transistor includes a plurality of drains and a plurality of sources alternately arranged in parallel, and a plurality of gate electrodes arranged between the drains and the sources. The drains are electrically coupled to an input/output pad through a plurality of first finger patterns which are coupled to a plurality of first contact patterns. The sources are electrically coupled to a specific voltage line through a path which comprises a plurality of second finger patterns coupled to a plurality of second contact patterns. The number of the first contact patterns corresponding to the drains is gradually reduced as the distance to the voltage line becomes shorter.

19 Claims, 4 Drawing Sheets

ESD PROTECTION CIRCUIT INCLUDING MULTI-FINGER TRANSISTOR

CROSS-REFERENCE TO RELATED APPLICATIONS

The present application claims priority of Korean Patent Application No. 10-2008-0127087, filed on Dec. 15, 2008, which is incorporated herein by reference in its entirety.

BACKGROUND OF THE INVENTION

Exemplary embodiments of the present invention relate to an electrostatic discharge (ESD) protection circuit for use in a semiconductor circuit, and more particularly, to a circuit configuration which is capable of preventing malfunction of a multi-finger transistor used in an ESD protection circuit.

When a semiconductor integrated circuit (IC) comes in contact with a charged human body or machine, static electricity charged in the human body or machine may be discharged to internal semiconductor circuits through external pins and input/output pads of the semiconductor IC. At this time, a transient current with high energy may cause severe damage to the internal semiconductor circuits. In some cases, static electricity charged in the inside of the semiconductor circuits may flow through the machine, due to the contact with the machine, and cause damage to the machine.

In order to protect internal semiconductor circuits from such damage, most semiconductor ICs are provided with an ESD protection circuit coupled between an input/output pad and an internal semiconductor circuit.

FIG. 1 illustrates a typical ESD protection circuit that includes a multi-finger transistor.

Referring to FIG. 1, the conventional ESD protection circuit includes an input/output pad 100, a voltage pad 102, a voltage line 104, a plurality of first finger patterns 110, 112, 114 and 116 corresponding to a plurality of drains, a plurality of second finger patterns 120, 122, 124, 126 and 128 corresponding to a plurality of sources, and a plurality of gate electrodes 130, 131, 132, 133, 134, 135, 136 and 137.

In the conventional multi-finger transistor of FIG. 1, the first finger patterns 110, 112, 114 and 116 corresponding to the drains, and the second finger patterns 120, 122, 124, 126 and 128 corresponding to the sources are alternately arranged in parallel.

The gate electrodes 130, 131, 132, 133, 134, 135, 136 and 137 are arranged between the first finger patterns 110, 112, 114 and 116 and the second finger patterns 120, 122, 124, 126 and 128, respectively.

The drains are coupled to the input/output pad 100 through the first finger patterns 110, 112, 114 and 116, which are coupled to a plurality of first contact patterns (shown in FIG. 1 as a plurality of small squares in each of the first finger patterns 110, 112, 114 and 116). The sources are coupled to the specific voltage line 104 through a path, which includes the second finger patterns 120, 122, 124, 126 and 128 and the voltage pad 102, through a plurality of second contact patterns (shown in FIG. 1 as a plurality of small squares in each of the second finger patterns 120, 122, 124, 126 and 128). The gate electrodes 130, 131, 132, 133, 134, 135, 136 and 137 are coupled to the voltage line 104 through the sources and the voltage pad 102.

When positive static electricity is applied to the input/output pad 100, an ESD path R1 is formed from the first finger pattern 110, corresponding to the drain, through the second finger pattern 120, corresponding to the source, to the voltage line 104. An ESD path R4 is formed from the first finger pattern 116, corresponding to the drain, through the second finger pattern 126, corresponding to the source, to the voltage line 104.

Although only two ESD paths R1 and R4 are illustrated in FIG. 1, more ESD paths may be formed according to the number of the finger patterns.

In the multi-finger transistor, the ESD paths are formed by the respective finger patterns between the input/output pad 100 and the voltage line 104. Since a normal current (IT2), that the finger patterns can endure without malfunctioning, is already determined in a design step, the multi-finger transistor may malfunction when an ESD current more than the normal current (IT2) is transmitted through the finger patterns.

The ESD path R1 is the shortest ESD path because it is closest to the voltage line 104. Thus, the ESD path R1 has the lowest resistance. On the other hand, the ESD path R4 is the longest ESD path because it is farthest from the voltage line 104. Hence, the ESD path R4 has the highest resistance.

Therefore, most of the ESD current is transmitted through the ESD path R1 with the lowest resistance instead of through the ESD path R4 with the highest resistance. Consequently, a different amount of ESD current is transmitted through the respective ESD paths. In other words, among the ESD paths, the largest amount of ESD current is transmitted through the ESD path R1.

If an excessive amount of ESD current is transmitted through the ESD path R1, and this ESD current is larger than the normal current (IT2), the contact patterns of the finger patterns forming the ESD path R1 may be melted, causing malfunction of the multi-finger transistor.

Even though the malfunction occurs in any one of the finger patterns, the entire ESD protection circuit cannot be used any more. Therefore, as described above, if the malfunction is caused by the melting of a contact pattern of a specific finger pattern, the entire multi-finger transistor does not properly operate as the ESD protection circuit.

One of methods for preventing such a malfunction is to increase the size of a unit finger pattern of the multi-finger transistor to increase an amount of transmitted ESD current the respective finger patterns can endure. In this case, however, the layout area of the multi-finger transistor increases, which is a concern in fabricating highly integrated semiconductor devices.

SUMMARY OF THE INVENTION

An exemplary embodiment of the present invention is directed to an ESD protection circuit configured to transmit uniform ESD currents through finger patterns by providing the finger patterns with a different number of contact patterns in a multi-finger transistor, so that the finger patterns may have the same path resistance.

In accordance with an embodiment of the present invention, an electrostatic discharge (ESD) protection circuit includes: a multi-finger transistor comprising a plurality of drains and a plurality of sources alternately arranged in parallel, and a plurality of gate electrodes arranged between the drains and the sources, wherein the drains are electrically coupled to an input/output pad through a plurality of first finger patterns which are coupled to a plurality of first contact patterns, the sources are electrically coupled to a specific voltage line through a path which comprises a plurality of second finger patterns coupled to a plurality of second contact patterns, and the number of the first contact patterns corresponding to the drains is gradually reduced as the distance to the voltage line becomes shorter.

In accordance with another embodiment of the present invention, an electrostatic discharge (ESD) protection circuit includes: a multi-finger transistor comprising a plurality of drains and a plurality of sources alternately arranged in parallel, and a plurality of gate electrodes arranged between the drains and the sources, wherein the drains are electrically coupled to an input/output pad through a plurality of first finger patterns which are coupled to a plurality of first contact patterns, the sources are electrically coupled to a specific voltage line through a path which comprises a plurality of second finger patterns coupled to a plurality of second contact patterns, and the number of the second contact patterns is gradually reduced as the distance to the voltage line becomes shorter.

In accordance with yet another embodiment of the present invention, an electrostatic discharge (ESD) protection circuit includes: a multi-finger transistor comprising a plurality of drains and a plurality of sources alternately arranged in parallel, and a plurality of gate electrodes arranged between the drains and the sources, wherein the drains are electrically coupled to an input/output pad through a plurality of first finger patterns which are coupled to a plurality of first contact patterns, the sources are electrically coupled to a specific voltage line through a path which comprises a plurality of second finger patterns coupled to a plurality of second contact patterns, and the number of the first and second contact patterns corresponding to pairs of the adjacent drain and source is gradually reduced as the distance to the voltage line becomes shorter.

In accordance with further yet another embodiment of the present invention, an electrostatic discharge (ESD) protection circuit includes: a multi-finger transistor comprising a plurality of drains and a plurality of sources alternately arranged in parallel, and a plurality of gate electrodes arranged between the drains and the sources, wherein the drains are electrically coupled to an input/output pad through a plurality of first finger patterns which are coupled to a plurality of first contact patterns, the sources are electrically coupled to a specific voltage line through a path which comprises a plurality of second finger patterns coupled to a plurality of second contact patterns, and the number of the first contact pattern or the number of the second contact pattern is gradually reduced as the distance to the voltage line becomes shorter.

DESCRIPTION OF SPECIFIC EMBODIMENTS

Figure 1:
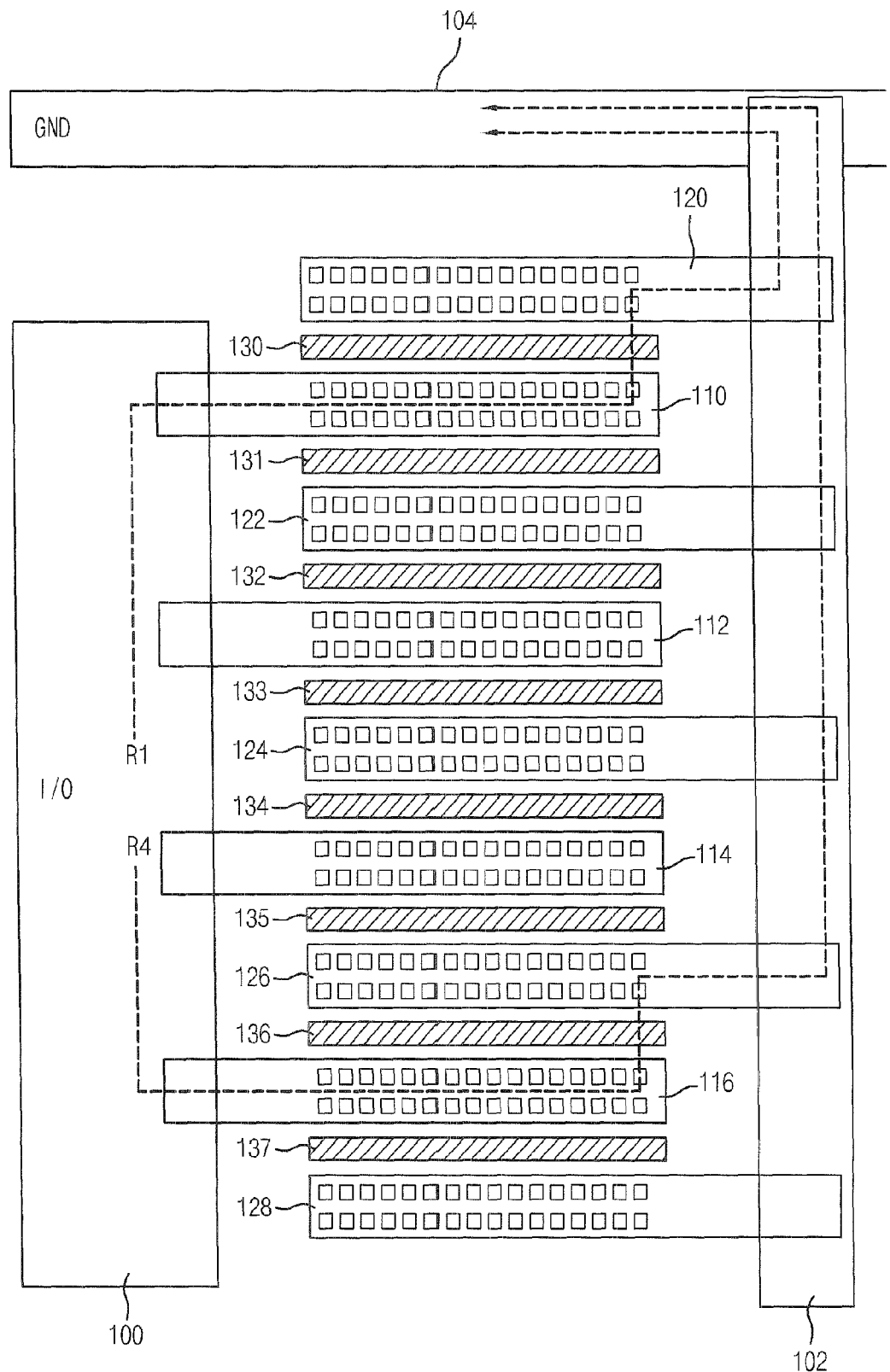
FIG. 1 illustrates a conventional ESD protection circuit with a multi-finger transistor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Exemplary embodiments of the present invention are directed to providing ESD protection circuits, which are capable of improving ESD capability and preventing malfunction in specific finger patterns by providing finger patterns with a different number of contact patterns in a multi-finger transistor, so that a uniform ESD current may be transmitted through the respective finger patterns.

Figure 2:
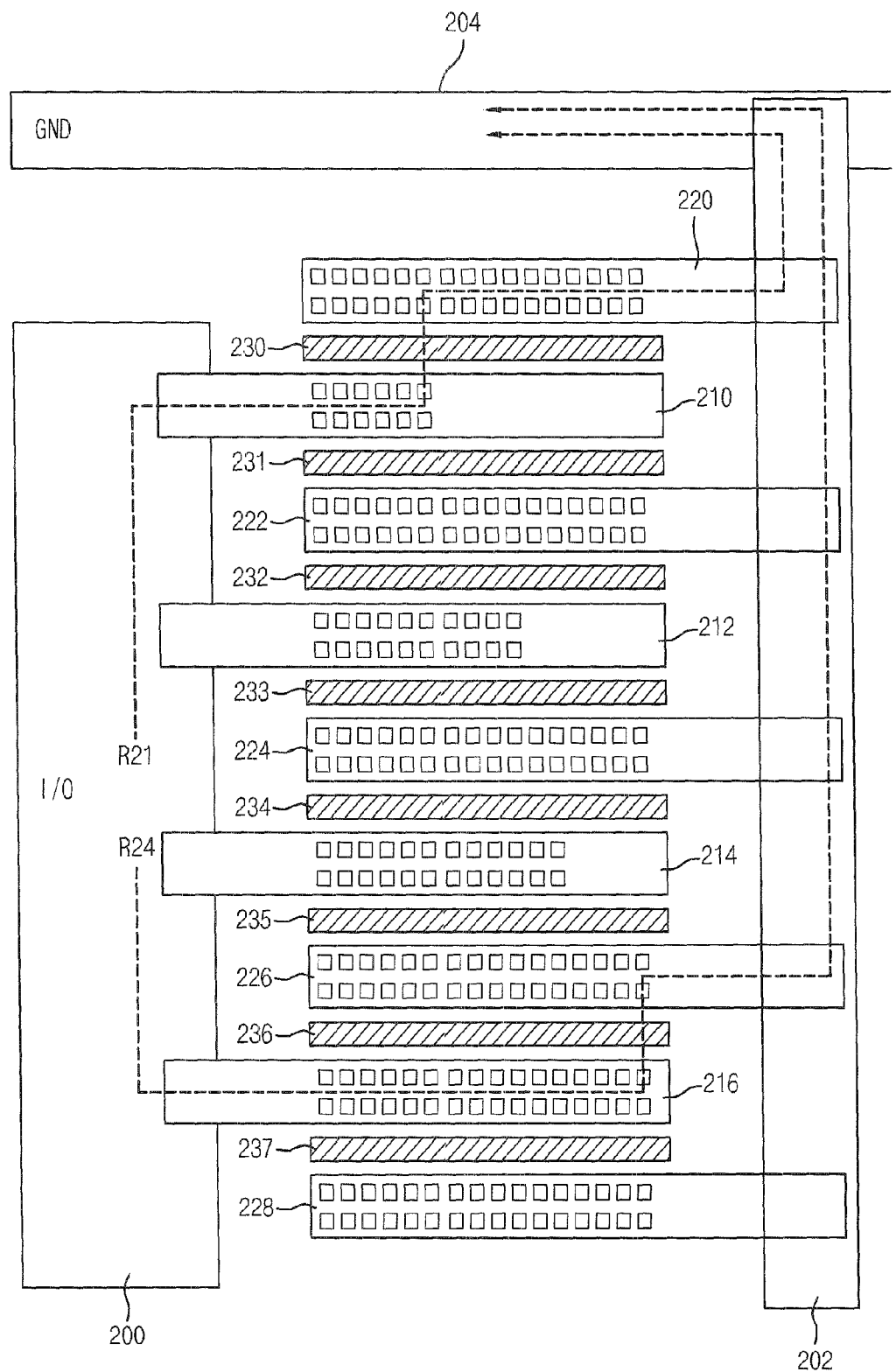
FIG. 2 illustrates an ESD protection circuit in accordance with a first embodiment of the present invention.

FIG. 2 illustrates an ESD protection circuit in accordance with a first embodiment of the present invention.

Referring to FIG. 2, the ESD protection circuit includes an input/output pad 200, a voltage pad 202, a voltage line 204, a plurality of first finger patterns 210, 212, 214 and 216 corresponding to a plurality of drains, a plurality of second finger patterns 220, 222, 224, 226 and 228 corresponding to a plurality of sources, and a plurality of gate electrodes 230, 231, 232, 233, 234, 235, 236 and 237.

The drains and the sources are alternately arranged in parallel in a semiconductor active region.

The drains are electrically coupled to the input/output pad 200 through the first finger patterns 210, 212, 214 and 216, which are coupled to a plurality of first contact patterns (shown in FIG. 2 as a plurality of small squares in each of the first finger patterns 210, 212, 214 and 216).

The sources are electrically coupled to the specific voltage line 204 through a path, which includes the voltage pad 202 and the second finger patterns 220, 222, 224, 226 and 228 coupled to a plurality of second contact patterns (shown in FIG. 2 as a plurality of small squares in each of the second finger patterns 220, 222, 224, 226 and 228).

The gate electrodes 230, 231, 232, 233, 234, 235, 236 and 237 are arranged between the first finger patterns 210, 212, 214 and 216 and the second finger patterns 220, 222, 224, 226 and 228, respectively.

The first finger patterns 210, 212, 214 and 216 corresponding to the drains, and the second finger patterns 220, 222, 224, 226 and 228 corresponding to the sources, are arranged in parallel.

The first finger pattern 210 corresponding to the drain is arranged closest to the voltage line 204, and the remaining first finger patterns 212, 214 and 216 are arranged at constant intervals.

The second finger pattern 220 corresponding to the source is arranged closest to the voltage line 204, and the remaining second finger patterns 222, 224, 226 and 228 are arranged at constant intervals.

The first contact patterns couple the first finger patterns 210, 212, 214 and 216 to the drains. As the distance to the voltage line 204 becomes shorter, a smaller number of the first contact patterns are provided to the first finger patterns.

The second contact patterns connect the second finger patterns 220, 222, 224, 226 and 228 to the sources. The same number of the second contact patterns is provided to the second finger patterns, regardless of the distance to the voltage line 204.

The operational principle of the ESD protection circuit will be described below with reference to FIG. 2.

When positive static electricity is applied to the input/output pad 200, an ESD path R21 is formed from the first finger pattern 210, corresponding to the drain, through the second finger pattern 220, corresponding to the source, to the voltage line 204.

In addition, an ESD path R24 is formed from the first finger pattern 216, corresponding to the drain, through the second finger pattern 226, corresponding to the source, to the voltage line 204.

Although only two ESD paths R21 and R24 are illustrated in FIG. 2, more ESD paths may be formed by the first finger patterns and the second finger patterns. However, the ESD protection circuit in accordance with the first embodiment of the present invention can be easily understood from the description of FIG. 2, based on the assumption that only two ESD paths are formed.

If the respective finger patterns are designed to have the same number of the contact patterns, then the ESD path R21 has low resistance because it is short, whereas the ESD path R24 has high resistance because it is long.

If the resistance of the ESD path is low, a larger amount of current is transmitted at the same voltage level. Hence, non-uniform ESD currents are transmitted through the ESD paths R21 and R24 formed by the finger patterns.

In order to prevent the transmission of the non-uniform ESD currents in FIG. 2, the resistance of the ESD path R21 may be increased and the resistance of the ESD path R24 may be decreased. Therefore, as the distance to the voltage line 204 becomes shorter, a smaller number of the first contact patterns are provided to the first finger patterns 210, 212, 214 and 216 corresponding to the drains.

Therefore, the first finger pattern 210 located closest to the voltage line 204 has the smallest number of the first contact patterns, and the first finger pattern 216 located farthest from the voltage line 204 has the largest number of the first contact patterns, as can be seen in FIG. 2 by the difference in numbers of small squares within the first finger patterns 210 and 216, respectively.

There are various methods that can be used to provide a decreasing number of the first contact patterns to the first finger patterns as the distance to the voltage line 204 becomes shorter. One method is to decrease the number of the first contact patterns by a predetermined number, based on drains. Another method is to decrease the number of the first contact patterns by a predetermined number, based on drain groups.

In this way, the respective ESD paths R21 and R24 may be designed to have the same resistance by providing a decreasing number of the first contact patterns to the first finger patterns as the distance to the voltage line 204 becomes shorter.

If the respective ESD paths R21 and R24 are designed to have the same resistance, uniform ESD currents are transmitted through the ESD paths, and thus it is possible to prevent the malfunction of the multi-finger transistor caused by melting of the contact patterns of the specific finger patterns, that occur when excessive ESD currents are transmitted through specific finger patterns.

Figure 3:
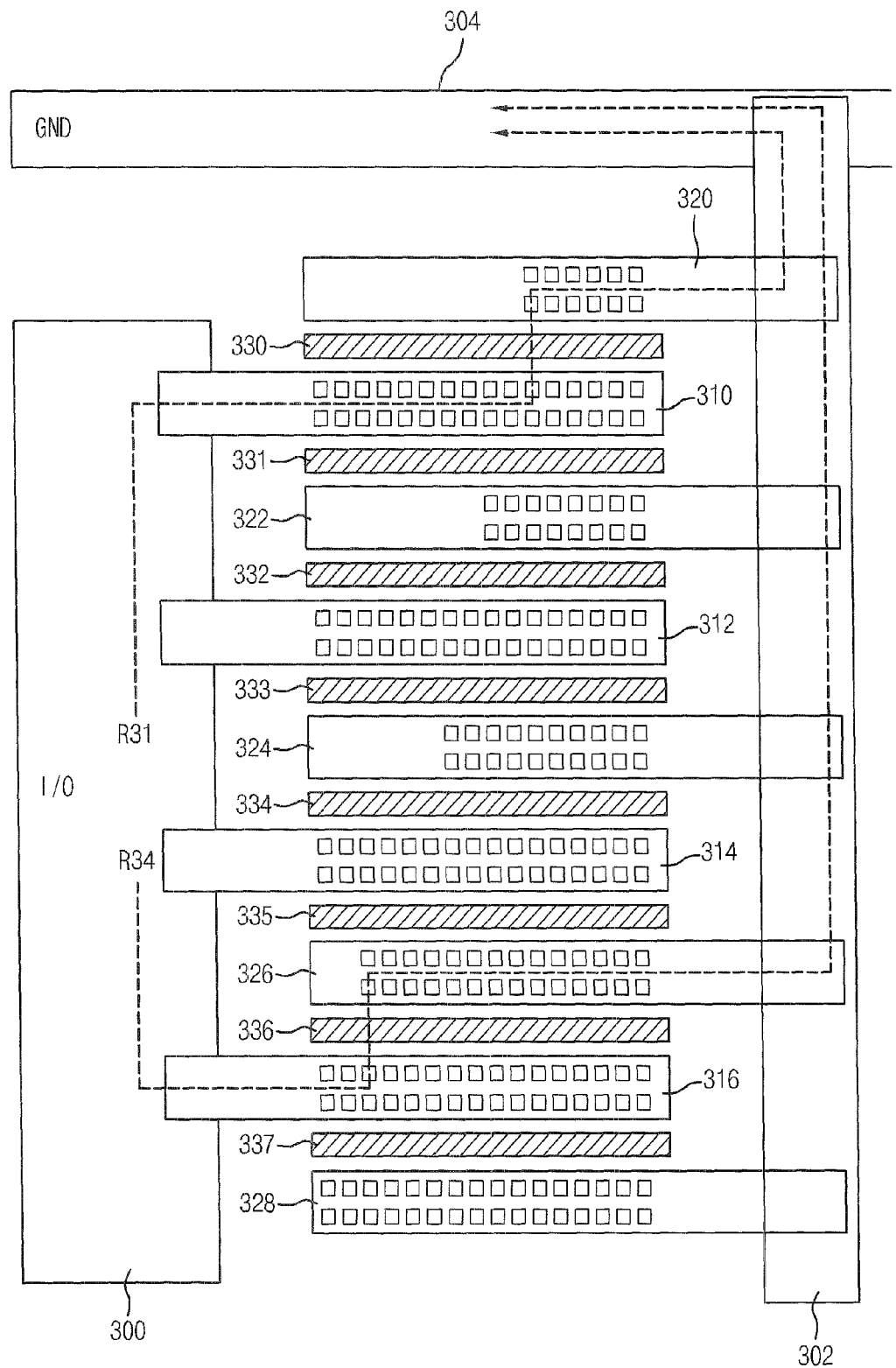
FIG. 3 illustrates an ESD protection circuit in accordance with a second embodiment of the present invention.

FIG. 3 illustrates an ESD protection circuit in accordance with a second embodiment of the present invention.

Referring to FIG. 3, the ESD protection circuit includes an input/output pad 300, a voltage pad 302, a voltage line 304, a plurality of first finger patterns 310, 312, 314 and 316 corresponding to a plurality of drains, a plurality of second finger patterns 320, 322, 324, 326 and 328 corresponding to a plurality of sources, and a plurality of gate electrodes 330, 331, 332, 333, 334, 335, 336 and 337.

The first contact patterns (shown in FIG. 3 by a plurality of small squares in each of the first finger patterns 310, 312, 314 and 316) connect the first finger patterns 310, 312, 314 and 316 to the drains. The same number of the first contact patterns is provided to the first finger patterns, regardless of the distance to the voltage line 304.

The second contact patterns (shown in FIG. 3 by a plurality of small squares in each of the second finger patterns 320, 322, 324, 326 and 328) connect the second finger patterns 320, 322, 324, 326 and 328 to the sources. As the distance to the voltage line 304 becomes shorter, a smaller number of the second contact patterns are provided to the second finger patterns.

The operational principle of the ESD protection circuit will be described below with reference to FIG. 3.

When positive static electricity is applied to the input/output pad 300, an ESD path R31 is formed from the first finger pattern 310 corresponding to a drain, through the second finger pattern 320 corresponding to a source, to the voltage line 304.

In addition, an ESD path R34 is formed from the first finger pattern 316, corresponding to a drain through the second finger pattern 326 corresponding to a source, to the voltage line 304.

Although only two ESD paths R31 and R34 are illustrated in FIG. 3, various ESD paths may be formed by the first finger patterns and the second finger patterns. However, the ESD protection circuit in accordance with the second embodiment of the present invention can be easily understood from the description of FIG. 3, based on the assumption that only two ESD paths are formed.

If the respective finger patterns are designed to have the same number of the contact patterns, then the ESD path R31 has low resistance because it is short, whereas the ESD path R34 has high resistance because it is long.

If the resistance of the ESD path is low, a larger amount of current is transmitted at the same voltage level. Hence, non-uniform ESD currents are transmitted through the ESD paths formed by the finger patterns.

In order to prevent the transmission of the non-uniform ESD currents, the resistance of the ESD path R31 may be increased and the resistance of the ESD path R34 may be decreased. Therefore, as the distance to the voltage line 304 becomes shorter, a smaller number of the second contact patterns are provided to the second finger patterns 320, 322, 324, 326 and 328 corresponding to the sources.

Therefore, the second finger pattern 320 located closest to the voltage line 304 has the smallest number of the second contact patterns, and the second finger pattern 328 located farthest from the voltage line 304 has the largest number of the second contact patterns, as can be seen in FIG. 3 by the difference in numbers of small squares in the second finger patterns 320 and 328, respectively.

There are various methods that can be used to provide a decreasing number of the second contact patterns to the second finger patterns as the distance to the voltage line 204 becomes shorter. One method is to decrease the number of the second contact patterns by a predetermined number, based on sources. Another method is to decrease the number of the second contact patterns by a predetermined number, based on source groups.

In this way, the respective ESD paths R31 and R34 may be designed to have the same resistance by providing a decreasing number of the second contact patterns to the second finger patterns as the distance to the voltage line 304 becomes shorter.

If the respective ESD paths R31 and 34 are designed to have the same resistance, uniform ESD currents are transmitted through the ESD paths, and thus it is possible to prevent the malfunction of the multi-finger transistor caused by melting of the contact patterns of the specific finger patterns, that occur when excessive ESD currents are transmitted through the specific finger patterns.

Figure 4:
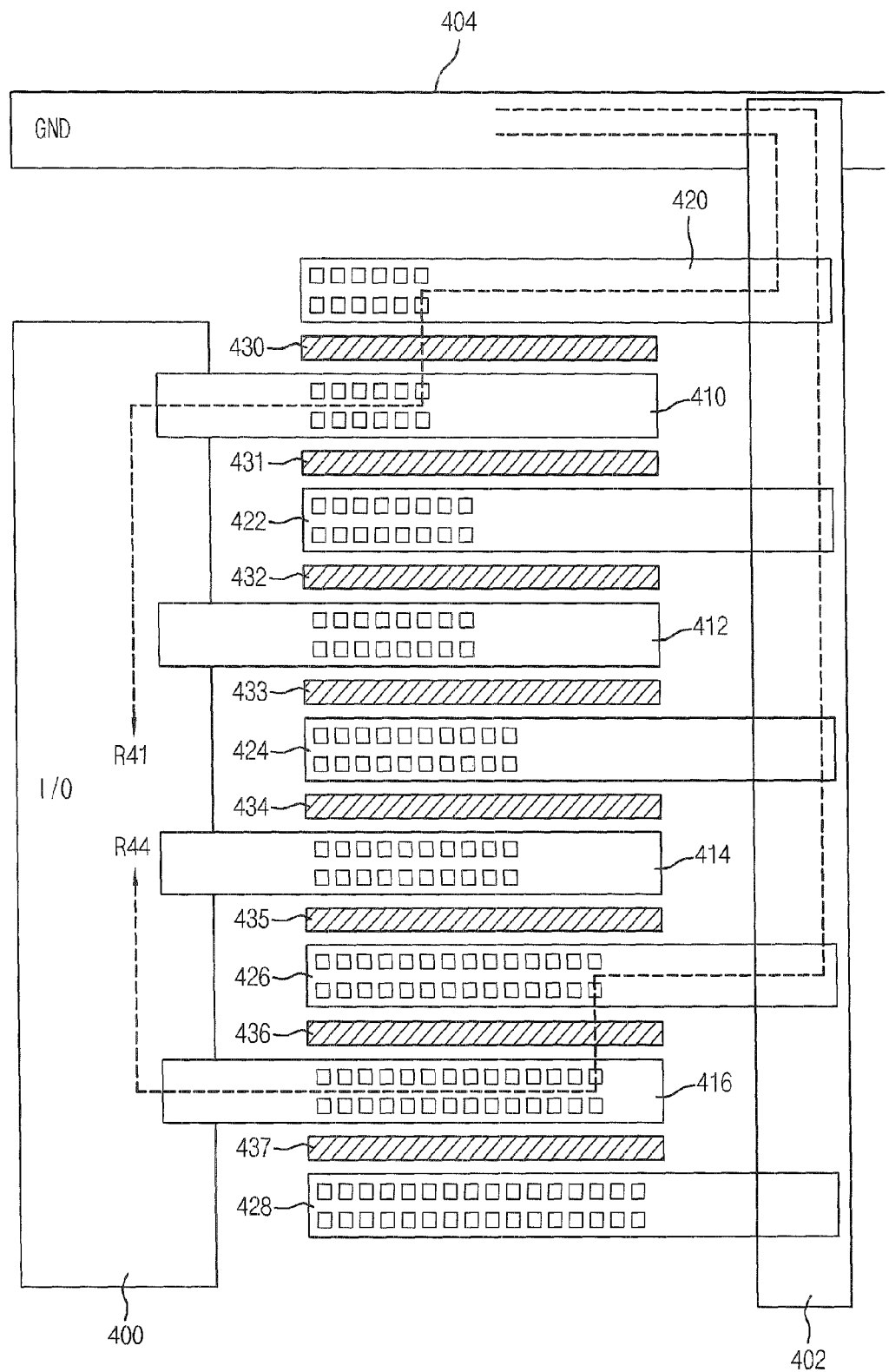
FIG. 4 illustrates an ESD protection circuit in accordance with a third embodiment of the present invention.

FIG. 4 illustrates an ESD protection circuit in accordance with a third embodiment of the present invention.

Referring to FIG. 4, the ESD protection circuit includes an input/output pad 400, a voltage pad 402, a voltage line 404, a plurality of first finger patterns 410, 412, 414 and 416 corresponding to a plurality of drains, a plurality of second finger patterns 420, 422, 424, 426 and 428 corresponding to a plurality of sources, and a plurality of gate electrodes 430, 431, 432, 433, 434, 435, 436 and 437.

The first contact patterns (shown in FIG. 4 as a plurality of small squares in each of the first finger patterns 410, 412, 414 and 416) connect the first finger patterns 410, 412, 414 and 416 to the drains. As the distance to the voltage line 404 becomes shorter, a smaller number of the first contact patterns are provided to the first finger patterns.

The second contact patterns (shown in FIG. 4 as a plurality of small squares in each of the second finger patterns 420, 422, 426 and 428) connect the second finger patterns 420, 422, 424, 426 and 428 to the sources. As the distance to the voltage line 404 becomes shorter, a smaller number of the second contact patterns are provided to the second finger patterns.

The operational principle of the ESD protection circuit will be described below with reference to FIG. 4.

When positive static electricity is applied to the input/output pad 400, an ESD path R41 is formed from the first finger pattern 410 corresponding to a drain through the second finger pattern 420 corresponding to a source to the voltage line 404.

In addition, an ESD path R44 is formed from the first finger pattern 416, corresponding to a drain through the second finger pattern 426 corresponding to a source, to the voltage line 404. If negative static electricity is applied, ESD paths opposite to the ESD paths R41 and R44 are formed.

Although only two ESD paths R41 and R44 are illustrated in FIG. 4, various ESD paths may be formed by the first finger patterns and the second finger patterns. However, the ESD protection circuit in accordance with the third embodiment of the present invention can be easily understood from the description of FIG. 4 based on the assumption that only two ESD paths are formed.

If the respective finger patterns are designed to have the same number of the contact patterns, then the ESD path R41 has low resistance because it is short, whereas the ESD path R44 has high resistance because it is long.

If the resistance of the ESD path is low, a larger amount of current is transmitted at the same voltage level. Hence, non-uniform ESD currents are transmitted through the ESD paths formed by the finger patterns.

In order to prevent the transmission/flow of the non-uniform ESD currents, the resistance of the ESD path R41 may be increased and the resistance of the ESD path R44 may be decreased. Therefore, as the distance to the voltage line 404 becomes shorter, a smaller number of the first contact patterns are provided to the first finger patterns 410, 412, 414 and 416 corresponding to the drains. In addition, as the distance to the voltage line 404 becomes shorter, a larger number of the second contact patterns are provided to the second finger patterns 420, 422, 424, 426 and 428 corresponding to the sources.

Therefore, the first finger pattern 410 located closest to the voltage line 404 has the smallest number of the first contact patterns, and the first finger pattern 416 located farthest from the voltage line 404 has the largest number of the first contact patterns, as can be seen in FIG. 4 by the difference in numbers of small squares in the first finger patterns 410 and 416, respectively. In addition, the second finger pattern 420 disposed closest to the voltage line 404 has the smallest number of the second contact patterns, and the second finger pattern 426 disposed farthest from the voltage line 404 has the largest number of the second contact patterns, as can be seen in FIG. 4 by the difference in numbers of small squares in the second finger patterns 420 and 428, respectively.

There are various methods that can be used to provide a decreasing number of the first contact patterns and the second contact patterns to the first finger patterns and the second finger patterns as the distance to the voltage line 404 becomes shorter. One method is to decrease the number of the first contact patterns and the second contact patterns by a predetermined number, based on a pair of source and drain. Another method is to decrease the number of the first contact patterns and the second contact patterns by a predetermined number, based on several pairs of drain and source groups.

In this way, the respective ESD paths R41 and R44 may be designed to have the same resistance by providing a decreasing number of the first contact patterns and the second contact patterns to the first finger patterns and the second finger patterns as the distance to the voltage line 404 becomes shorter.

If the respective ESD paths R41 and R44 are designed to have the same resistance, uniform ESD currents are transmitted through the ESD paths and thus it is possible to prevent the malfunction of the multi-finger transistor caused by melting of the contact patterns of the specific finger patterns, that occur when excessive ESD currents are transmitted through the specific finger patterns.

In the third embodiment of FIG. 4, the ESD paths may be designed to have the same resistance in a more efficient manner by providing a smaller number of the contact patterns to the finger patterns corresponding to the drains and the sources as the distance to the voltage line 404 becomes shorter.

Consequently, the uniform ESD currents may be made to be transmitted through the respective ESD paths by providing a different number of contact patterns to the respective finger patterns. Hence, no over-current is transmitted through the specific finger patterns. Thus, it is possible to prevent malfunction of the multi-finger transistor caused by the melting of the specific finger pattern, and improve the ESD capability without significant increase of the layout area.

In the multi-finger transistor used in the ESD protection circuit, it is possible to improve ESD capability and prevent malfunction in specific finger patterns by enabling uniform ESD current transmission through the respective finger patterns.

While the present invention has been described with respect to the specific embodiments, it will be apparent to those skilled in the art that various changes and modifications may be made without departing from the spirit and scope of the invention as defined in the following claims.

What is claimed is:

1. An electrostatic discharge (ESD) protection circuit, comprising:
   a multi-finger transistor comprising a plurality of drains and a plurality of sources alternately arranged in parallel, and a plurality of gate electrodes arranged between the drains and the sources,
   wherein the drains are electrically coupled to an input/output pad through a plurality of first finger patterns which are coupled to a plurality of first contact patterns,
   the sources are electrically coupled to a specific voltage line through a path which comprises a plurality of second finger patterns coupled to a plurality of second contact patterns, and the number of the first contact patterns corresponding to the drains is gradually reduced as the distance to the voltage line becomes shorter.

2. The ESD protection circuit of claim 1, wherein the voltage line is a ground voltage line.

3. The ESD protection circuit of claim 1, wherein the voltage line is a power supply voltage line.

4. The ESD protection circuit of claim 1, wherein the number of the first contact patterns is reduced based on the drains.

5. The ESD protection circuit of claim 1, wherein the number of the first contact patterns is reduced based on a drain group including a predetermined number of the drains.

6. The ESD protection circuit of claim 5, wherein the number of the first contact patterns is reduced by an equal number.

7. An electrostatic discharge (ESD) protection circuit, comprising:
- a multi-finger transistor comprising a plurality of drains and a plurality of sources alternately arranged in parallel, and a plurality of gate electrodes arranged between the drains and the sources,
- wherein the drains are electrically coupled to an input/output pad through a plurality of first finger patterns which are coupled to a plurality of first contact patterns,
- the sources are electrically coupled to a specific voltage line through a path which comprises a plurality of second finger patterns coupled to a plurality of second contact patterns, and
- the number of the second contact patterns is gradually reduced as the distance to the voltage line becomes shorter.

8. The ESD protection circuit of claim 7, wherein the voltage line is a ground voltage line.

9. The ESD protection circuit of claim 7, wherein the voltage line is a power supply voltage line.

10. The ESD protection circuit of claim 7, wherein the number of the second contact patterns is reduced based on the sources.

11. The ESD protection circuit of claim 7, wherein the number of the second contact patterns is reduced based on a source group including a predetermined number of the sources.

12. The ESD protection circuit of claim 11, wherein the number of the second contact patterns is reduced by an equal number.

13. An electrostatic discharge (ESD) protection circuit, comprising:
- a multi-finger transistor comprising a plurality of drains and a plurality of sources alternately arranged in parallel, and a plurality of gate electrodes arranged between the drains and the sources,
- wherein the drains are electrically coupled to an input/output pad through a plurality of first finger patterns which are coupled to a plurality of first contact patterns,
- the sources are electrically coupled to a specific voltage line through a path which comprises a plurality of second finger patterns coupled to a plurality of second contact patterns, and
- the number of the first and second contact patterns corresponding to pairs of the adjacent drain and source is gradually reduced as the distance to the voltage line becomes shorter.

14. The ESD protection circuit of claim 13, wherein the voltage line is a ground voltage line.

15. The ESD protection circuit of claim 13, wherein the voltage line is a power supply voltage line.

16. The ESD protection circuit of claim 13, wherein the number of the first and second contact patterns corresponding to the pairs of the adjacent drain and source is reduced based on the pairs of the drain and source.

17. The ESD protection circuit of claim 13, wherein the first and second contact patterns corresponding to the pairs of the drain and source is reduced based on a drain-source group including a predetermined number of the pairs of the drain and source.

18. The ESD protection circuit of claim 17, wherein the number of the first and second contact patterns corresponding to the pairs of the drain and source is reduced by an equal number, based on the pairs of the drain and source.

19. An electrostatic discharge (ESD) protection circuit, comprising:
- a multi-finger transistor comprising a plurality of drains and a plurality of sources alternately arranged in parallel, and a plurality of gate electrodes arranged between the drains and the sources,
- wherein the drains are electrically coupled to an input/output pad through a plurality of first finger patterns which are coupled to a plurality of first contact patterns,
- the sources are electrically coupled to a specific voltage line through a path which comprises a plurality of second finger patterns coupled to a plurality of second contact patterns, and
- the number of the first contact pattern or the number of the second contact pattern is gradually reduced as the distance to the voltage line becomes shorter.

* * * * *